United States Patent
Chen et al.

(10) Patent No.: US 7,294,279 B2
(45) Date of Patent: Nov. 13, 2007

(54) METHOD FOR RELEASING A MICROMECHANICAL STRUCTURE

(75) Inventors: Fei-Yun Chen, Hsinchu (TW); Tzu-Yang Wu, Hsinchu (TW); Shih-Shiung Chen, Chiayi (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 336 days.

(21) Appl. No.: 11/081,645

(22) Filed: Mar. 17, 2005

(65) Prior Publication Data

US 2006/0207964 A1 Sep. 21, 2006

(51) Int. Cl.
 *C23F 1/00* (2006.01)
 *B44C 1/22* (2006.01)
 *C03C 15/00* (2006.01)
 *C03C 25/68* (2006.01)
 *C25F 3/00* (2006.01)

(52) U.S. Cl. ............................ 216/2; 216/99; 216/24

(58) Field of Classification Search ................. 216/99, 216/2, 24; 510/175
See application file for complete search history.

(56) References Cited

U.S. PATENT DOCUMENTS 5,262,000 A * 11/1993 Welbourn et al. ............. 216/2
5,387,269 A * 2/1995 Nijander et al. ............. 65/386
5,911,835 A * 6/1999 Lee et al. ..................... 134/1.3
6,290,861 B1 9/2001 Patel et al.
6,356,378 B1 3/2002 Huibers
6,396,619 B1 5/2002 Huibers et al.
6,423,646 B1 * 7/2002 Yen et al. ..................... 438/753
2002/0197761 A1 12/2002 Patel et al.

FOREIGN PATENT DOCUMENTS

DE    19624316 A1 *  1/1998
JP    11031684 A  *  2/1999

* cited by examiner

*Primary Examiner*—Parviz Hassanzadeh
*Assistant Examiner*—Roberts Culbert
(74) *Attorney, Agent, or Firm*—Birch, Stewart, Kolasch & Birch, LLP

(57) ABSTRACT

A method for releasing a micromechanical structure. A substrate is provided. At least one micromechanical structural layer is provided above the substrate, wherein the micromechanical structural layer is sustained by a sacrificial layer of a silicon material. An amine-based etchant is provided to etch the silicon material. That is, during performing a post-cleaning procedure with an amine-based etchant, polymer residue and the sacrificial layer of silicon can be simultaneously removed without any additional etching processes.

11 Claims, 7 Drawing Sheets

METHOD FOR RELEASING A MICROMECHANICAL STRUCTURE

BACKGROUND OF THE INVENTION

1. Field of the Invention

The present invention relates to a method for releasing a micromechanical structure, and more particularly, to a method of etching an amorphous silicon layer during the microelectromechanical structure (MEMS) process.

2. Description of the Related Art

The use of selective etchants to remove sacrificial layers or regions in a multilayer structure without removal of an adjacent layer or region is a common step in the manufacture of semiconductor devices and MEMS. MEMS have found applications in inertial measurement, pressure sensing, thermal measurement, micro-fluidics, optics, and radio frequency communications, and the range of applications for these structures continues to grow. One example of such a structure is a reflective spatial light modulator, which is a device consisting of a planar array of electrostatically deflectable mirrors, each microscopic in size. The device is used as a micro-display system for high resolution and large screen projection. The sacrificial layer in such a device is the layer over which the mirror material is deposited. Once the mirror structure is formed, the sacrificial layer is removed to leave gaps below the mirrors and microhinge along one edge of each mirror to join the mirror to the remainder of the structure. The gap and the microhinge provide the mirror with the freedom of movement needed for its deflection. Devices of this type are described in, for example, U.S. Pat. No. 6,356,378.

The success of a manufacturing procedure for structures involving sacrificial layers depends on the selectivity of the etching process. The thickness and lateral dimensions of the layers, and in the case of the deflectable mirror structures, the width of the gap and the integrity of the microhinges, are all critical to achieve uniform microstructure properties and a high yield of defect-free product. One of the critical factors is the quality of the etching process. Performance, uniformity and yield can all be improved with increases in the etch selectivity of the sacrificial layer relative to the adjacent functional layers.

Among the etchants that are used for the removal of sacrificial layers or regions in etching procedures are noble gas fluorides and halogen fluorides. These materials, used in the gas phase, selectively etch silicon relative to other materials such as silicon-containing compounds, metallic elements, and compounds of metallic elements. The selectivity is not infinite, however, and would vary widely with the specific equipment, process, materials and reaction conditions. Xenon difluoride ($XeF_2$), for example, has demonstrated selectivity as high as 400:1 to 500:1. Nevertheless, the $XeF_2$ etcher is a special and expensive facility for current semiconductor processes, thereby increasing additional equipment and material costs. In addition, when the sacrificial layer is very thick (e.g. above 2000 Å), $XeF_2$ etching requires longer etching time, thereby reducing manufacturing efficiency.

In U.S. Patent Application No. 20020197761, Patel et al disclose a method for releasing a micromechanical structure. The method performs a first etch to remove a portion of the sacrificial material, wherein the first etch provides an etchant of $CH_4$ or $C_4H_8$ so as to allow the etchant to physically, or chemically and physically, remove the portion of the sacrificial material. Then, a second etch is performed to remove additional sacrificial material, wherein the second etch provides an etchant of $XeF_2$, $IF_5$, $IF_7$ or $BrF_3$ that chemically but not physically etches the additional sacrificial material. Though effective, this method nevertheless requires special and expensive dry etchers, such as the $XeF_2$ etcher.

In U.S. Pat. No. 6,290,864, Patel et al disclose a gas-phase etching procedures for the manufacture of MEMS. The method, utilizing etchant gases that are noble gas fluorides or halogen fluorides, is performed with greater selectivity toward the silicon portion relative to other portions of the microstructure by the addition of non-etchant gaseous additives to the etchant gas. Thus, this method still requires special and expensive dry etchers, such as the $XeF_2$ etcher.

In U.S. Pat. No. 6,396,619, Huibers et al disclose a deflectable spatial light modulator (SLM). The patent does not teach how to etch the sacrificial layer of amorphous silicon.

SUMMARY OF THE INVENTION

The object of the present invention is to provide a method for releasing a micromechanical structure.

Another object of the present invention is to provide a method of etching a sacrificial layer of silicon in a MEMS process.

Yet another object of the present invention is to provide a method of forming a micromirror structure.

In order to achieve these objects, the present invention provides a method for releasing a micromechanical structure. A substrate is provided. At least one micromechanical structural layer is provided above the substrate, wherein the micromechanical structural layer is sustained by a sacrificial layer of silicon. An amine-based etchant is provided to etch the sacrificial layer of silicon.

The present invention also provides a method of forming a micromirror structure. A substrate having a first surface and a second surface opposite to the first surface is provided, wherein a metal nitride layer is formed on the first surface of the substrate. A sacrificial layer of silicon is formed on the second surface of the substrate. Using an amine-based etchant, the sacrificial layer is partially etched to form at least one hole exposing a portion of the second surface of the substrate. The hole is filled with conductive material to form a plug serving as a mirror support structure to attach the substrate. A mirror plate is formed on the sacrificial layer to connect the plug. A photoresist layer is blanketly formed over the sacrificial layer and the mirror plate. Using the photoresist layer as a mask, the metal nitride layer is removed. In a preferred embodiment of the present invention, the photoresist layer is removed by $O_2$ ashing and polymer residue is created. A post-cleaning procedure with the amine-based etchant is performed to simultaneously etch the polymer residue and the sacrificial layer of silicon, thereby releasing the mirror plate and the mirror support structure.

The present invention also provides another method of forming a micromirror structure. A substrate having a first surface and a second surface opposite to the first surface is provided, wherein a metal nitride layer is formed on the first surface of the substrate. A first sacrificial layer of silicon is formed on the second surface of the substrate. A mirror plate is formed on the first sacrificial layer. A second sacrificial layer of silicon is formed on the first sacrificial layer and the mirror plate. Using an amine-based etchant, the first and second sacrificial layers are partially etched to create an opening exposing a portion of the mirror plate and at least one hole exposing a portion of the second surface of the substrate. The opening and the hole are filled with conductive material to define a mirror support structure to attach the mirror plate and the substrate. A photoresist layer is blanketly formed over the second sacrificial layer and the conductive material. Using the photoresist layer as a mask, the metal nitride layer is removed. In a preferred embodiment of the present invention, the photoresist layer is removed by $O_2$ ashing and polymer residue is created. A post-cleaning procedure with the amine-based etchant is performed to simultaneously etch the polymer residue and the sacrificial layers of silicon, thereby releasing the mirror plate and the mirror support structure.

The present invention improves on the background art in that the polymer residue and the sacrificial layer(s) having silicon can be simultaneously etched by current equipment with amine-based etchant. Thus, the micromechanical structure can be released without performing any additional process (e.g. the $XeF_2$ etching) to etch the sacrificial layer of silicon, thereby reducing tool and material costs and ameliorating the disadvantages of the background art.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1A:
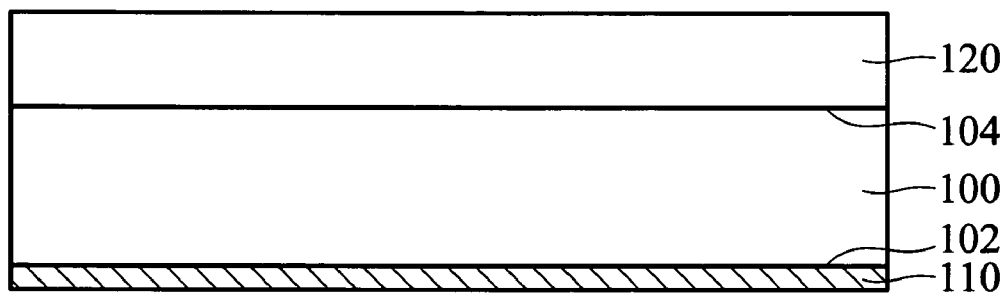
FIGS. 1A~1H are cross-sectional views, according to one method of manufacturing a MEMS device of the present invention.

An etching process proposed by this invention, used to simultaneously etch polymer residue (caused by dry-etching photoresist) and a sample comprising a silicon material in the fabrication of MEMS, is that an amine-based etchant comprising MEA (monoethanolamine) is provided to etch the silicon material. The amine-based etchant can further include DMSO (dimethyl sulfoxide) and inhibitor, or include HDA (hydroxylamine), $H_2O$, DGA (2-(2 amineoethoxy) ethanol), and Catechol. The silicon material can be amorphous silicon or crystalline silicon. In one embodiment of the present invention, the amine-based etchant comprises MEA (70 vol %), DMSO (25 vol %) and inhibitor (5 vol %) In another embodiment of the present invention, the amine-based etchant comprises MEA, HDA, $H_2O$, DGA and Catechol. When the amine-based etchant comprising MEA, DMSO and inhibitor is employed, the operational temperature ranges from 90° C. to 120° C. Preferably, the operational temperature is 115° C. When the amine-based etchant comprising MEA, HDA, $H_2O$, DGA and Catechol is employed, the operational temperature ranges from 60° C. to 80° C. Preferably, the operational temperature is 70° C.

The inventor provides experimental results (Tables 1, 2 and 3) showing that silicon material is preferentially etched relative to a material other than silicon when using the amine-based etchant of the present invention. The material other than silicon is a non-silicon metal, a compound of a non-silicon metal and a silicon-containing compound in which silicon is bonded to a non-silicon element. The etchant used in Table 1 is the amine-based etchant comprising MEA (70 vol %), DMSO (25 vol %) and inhibitor (5 vol %), which can be ACT-690C stripper made by ACT (Advanced Chemical Technology) Company and can operate at 115° C. The etchant used in Table 2 is the amine-based etchant comprising MEA, HDA, $H_2O$, DGA and Catechol, which can be EKC-270T stripper made by EKC Technology Company and has an operating temperature of 70° C. In contrast with Tables 1 and 2, the etchant used in Table 3 is the non-amine etchant comprising HDA, $H_2O$ and catechol, which is EKC-265 stripper made by EKC Technology Company and has an operating temperature of 65° C.

TABLE 1

| (Using ACT-690C stripper as the amine-based etchant of the present invention) | |
|---|---|
| The Etched Object | Etching Rate (Å/min) |
| AlCu | 0 |
| AlSiCu | 0 |
| Ti | 1.09 |
| TiN | 0 |
| PECVD-SiO$_2$ | 0.29 |
| Amorphous Silicon | 1100 |
| Polysilicon | 1100 |
| Polymer (caused by etching photoresist) | Very great (>1100) |

TABLE 2

| (Using EKC-270T stripper as the amine-based etchant of the present invention) | |
|---|---|
| The Etched Object | Etching Rate (Å/min) |
| AlCu | 2.5 |
| AlSiCu | 1.58 |
| Ti | 1.35 |
| TiN | 0.82 |
| PECVD-SiO$_2$ | 0.71 |
| Amorphous Silicon | 1100 |
| Polysilicon | 900 |
| Polymer (caused by etching photoresist) | very great (>1100) |

TABLE 3

| (Using EKC-265 stripper as the non-amine etchant) | |
|---|---|
| The Etched Object | Etching Rate (Å/min) |
| AlCu | 0.7 |
| AlSiCu | 0.81 |
| Ti | 2.46 |
| TiN | 2.2 |
| PECVD-SiO$_2$ | 0.22 |
| Amorphous Silicon | 0.36 |
| Polysilicon | 0.21 |
| Polymer (caused by etching photoresist) | very great (>1100) |

Accordingly, it is verified that the amine-based etchant can simultaneously etch silicon (amorphous silicon or crystalline silicon) and polymer residue (caused by etching photoresist), without damaging the non-silicon material. It should be noted that ACT-690C has a better etching selectivity than EKC-270T. In addition, the present etching method can partially remove the silicon material under the time mode.

The present method is well suited for the MEMS process. A wide variety of MEMS devices can be made in accordance with the present invention, including microsensors, microvalves, micromirrors for optical scanning, microscopy, spectroscopy, maskless lithography, projection displays and optical switching, etc. The examples demonstrated below are micromirrors; however any of these or other MEMS devices can be made in accordance with the methods and materials of the present invention.

FIGS. 1A~1H are cross-sectional views of one method of manufacturing a MEMS device according to the present invention.

In FIG. 1A, a substrate 100 having a first surface 102 and a second surface 104 opposite to the first surface 102 is provided, wherein a metal nitride layer 110 is formed on the first surface 102 of the substrate 100. The substrate 100 is a light transmissive substrate, such as a glass or quartz substrate. The metal nitride layer 110 is typically a TiN layer, which can serve as a protection and light shield layer. That is, this example uses a transparent glass substrate with a backside metal nitride layer, which is a commercially available product.

In FIG. 1A, a sacrificial layer 120 having a silicon material is formed on the second surface 104 of the substrate 100. The silicon material is amorphous silicon or crystalline silicon deposited by plasma enhanced chemical vapor deposition (PECVD) or sputtering (physical vapor deposition of PVD). The thickness of the sacrificial layer 120 could be 5000~20000 Å. The amorphous silicon could be annealed to increase stability.

Figure 1B:

In FIG. 1B, using the amine-based etchant of the present invention, the sacrificial layer 120 is partially etched to form at least one hole (or aperture) 130 exposing a portion of the second surface 104 of the substrate 100. Then, a conductive material is deposited in the hole 130 to form a plug 135 serving as a mirror support structure to attach the substrate 100. The conductive material is, for example, W, Mo, Ti, Ta or a conductive metal compound. For some plug materials, it may be desirable to first deposit a linear (not shown) in order to avoid peeling (e.g., for a tungsten plug, a TiN, TiW or TiWN linear could be deposited to surround the tungsten in the hole in the sacrificial layer and later after release of the sacrificial layer). After this metal deposition, chemical mechanical polishing (CMP) is performed to form a smooth surface for the plug 135 and the sacrificial layer 120.

Figure 1C:
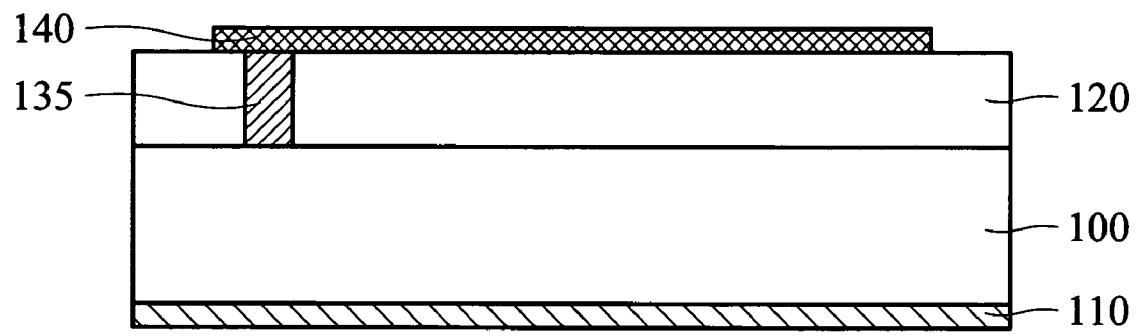

In FIG. 1C, a mirror plate 140 is formed on the sacrificial layer 120 and connects the plug 135. The mirror plate 140 can be a metal plate comprising Al, AlCu or AlSiCu, formed by sputtering and patterning. In this example, the mirror plate 140 is a reflective element deflectably coupled to the substrate 100 via the plug 135 (support structure) after the subsequent releasing process.

Figure 1D:
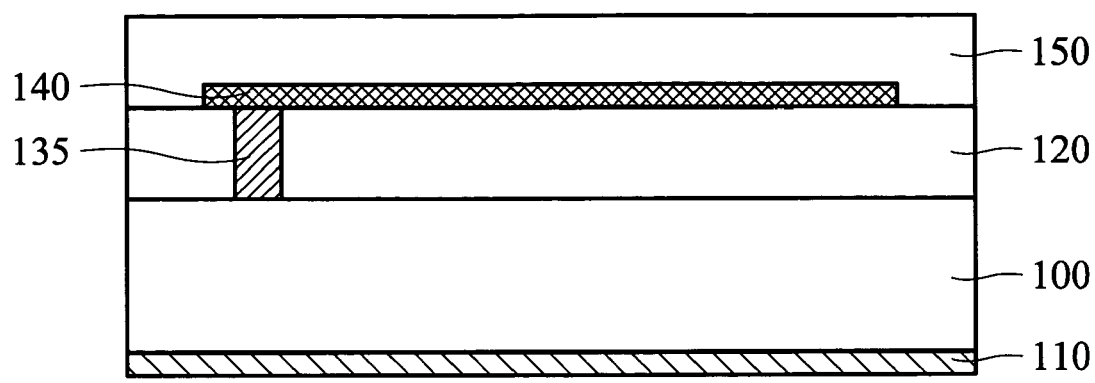

In FIG. 1D, a photoresist layer 150 is blanketly formed over the second surface 104 of the substrate 100.

Figure 1E:
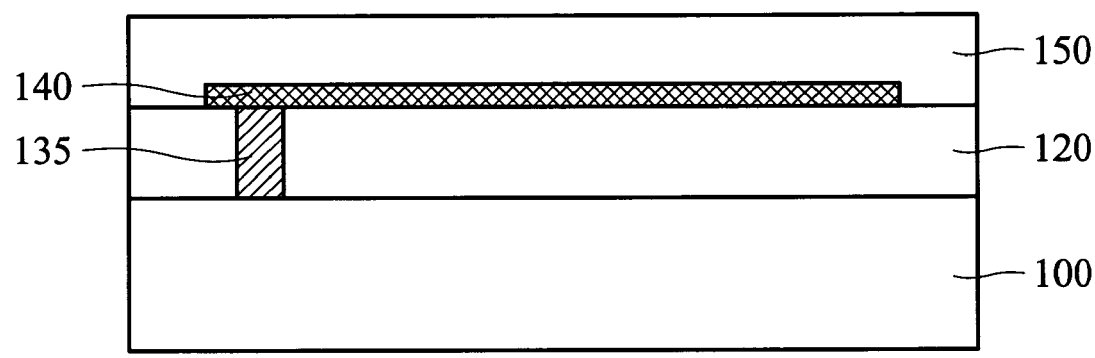

In FIG. 1E, using the photoresist layer 150 as an etching mask, the metal nitride layer 110 is removed. For example, the TiN layer 110 can be removed by dry etching using $F^-$-containing etchant gas.

Figure 1F:
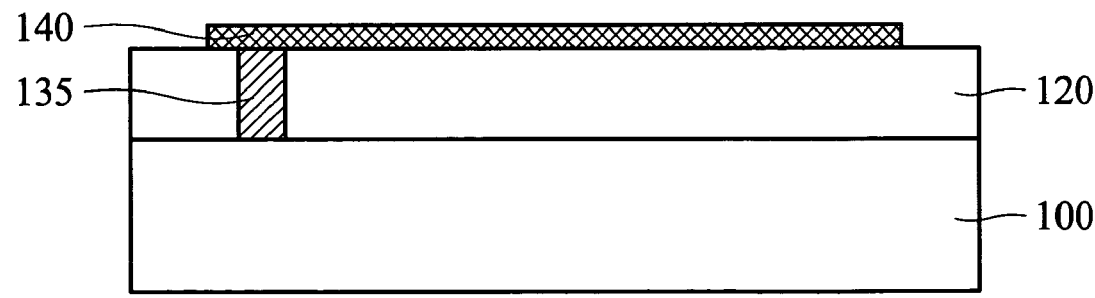

In FIG. 1F, using $O_2$ ashing, the photoresist layer 150 is removed. Nevertheless, polymer residue (not shown) is created during this step.

Figure 1G:
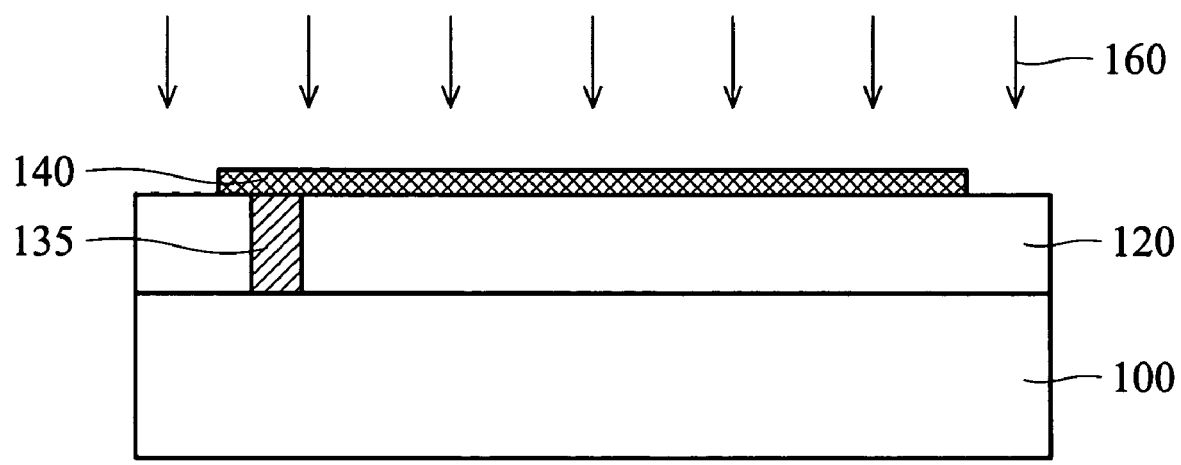
Figure 1H:
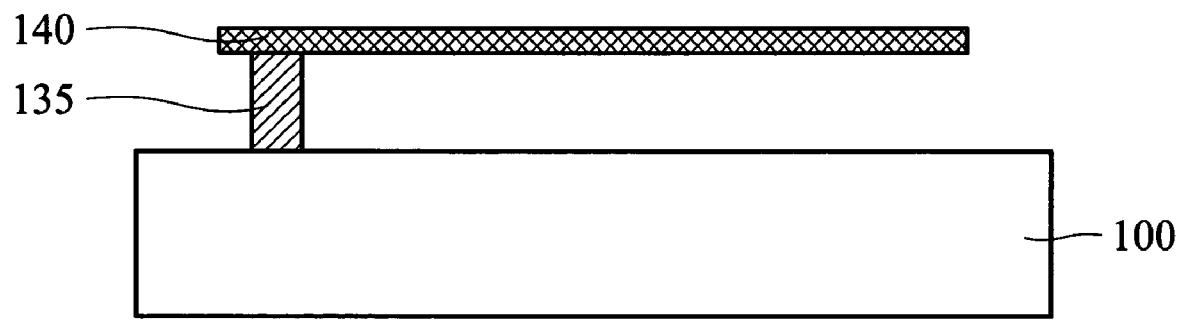

In FIG. 1G, a post-cleaning procedure 160 with the amine-based etchant is performed to simultaneously etch the polymer residue and the sacrificial layer 120 having the silicon material. It should be noted that the post-cleaning procedure 160 with the amine-based etchant can be performed with current wet cleaning equipment. As shown in FIG. 1H, the plug 135 and the mirror plate 140 (that is, a micromechanical structure) are thus released without performing any additional processes (e.g. the $XeF_2$ etching).

A demonstrative example of the post-cleaning procedure 160 is herein described, but is not intended to limit the present invention. After stripping the photoresist layer 150, the micromechanical device is immersed in ACT-690C for 30 minutes to simultaneously remove polymer residue and (amorphous) silicon, and then is immersed in NMP (N-Methyl-2-Pyrrolidone, serving as a neutralizer) for 5 minutes. Lastly, the micromechanical device is cleaned by DI (deionization) water rinse, and then is dried in a spin dryer.

FIGS. 2A~2H illustrate perspective views of a portion of a substrate, according to another method of manufacturing a MEMS device of the present invention.

Figure 2A:
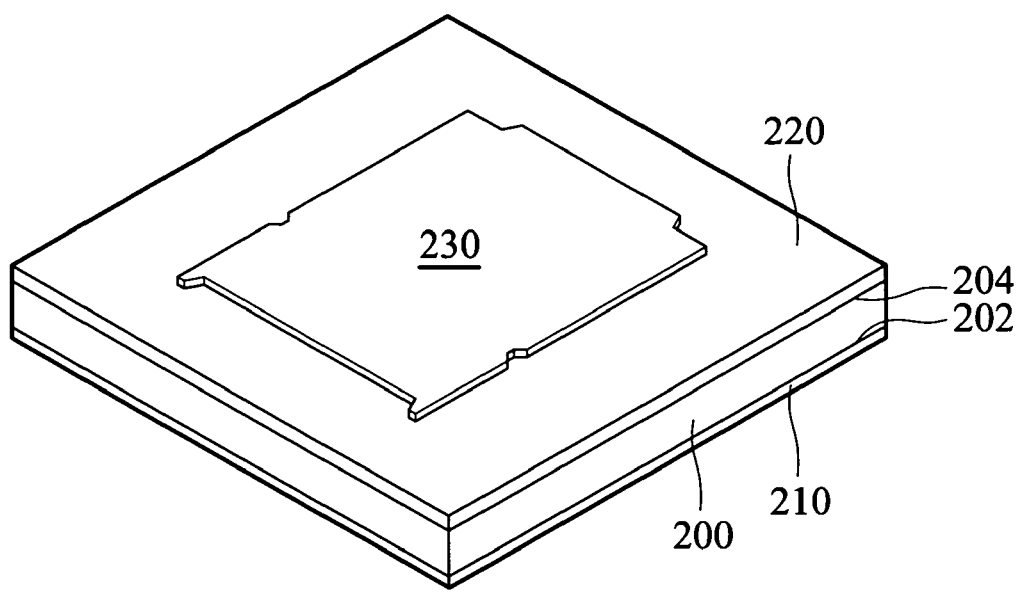
FIGS. 2A~2H illustrate perspective views of a portion of a substrate, according to another method of manufacturing a MEMS device of the present invention.

In FIG. 2A, a substrate 200 having a first surface 202 and a second surface 204 opposite to the first surface 202 is provided, wherein a metal nitride layer 210 is formed on the first surface 202 of the substrate 200. The substrate 200 is a light transmissive substrate, such as a glass or quartz substrate. The metal nitride layer 210 is typically a TiN layer, which can serve as a protection and light shield layer. That is, this example utilizes a transparent glass substrate with a backside metal nitride layer, which is a commercially available product.

In FIG. 2A, a first sacrificial layer 220 having a silicon material is formed on the second surface 204 of the substrate 200. The silicon material is amorphous silicon or crystalline silicon deposited by PECVD or sputtering. The amorphous silicon can be annealed to increase stability.

In FIG. 2A, a mirror plate 230 is formed on the first sacrificial layer 220. The mirror plate 230 can be a metal plate comprising Al, AlCu or AlSiCu, formed by sputtering and patterning. In this example, the mirror plate 230 is a reflective element deflectably coupled to the substrate 200. It should be noted that, in a typical SLM implementation in accordance with the present invention, an entire array of micromirrors is fabricated at the same time. For simplicity, other mirror plates that are formed on the substrate 200 are not illustrated.

Figure 2B:
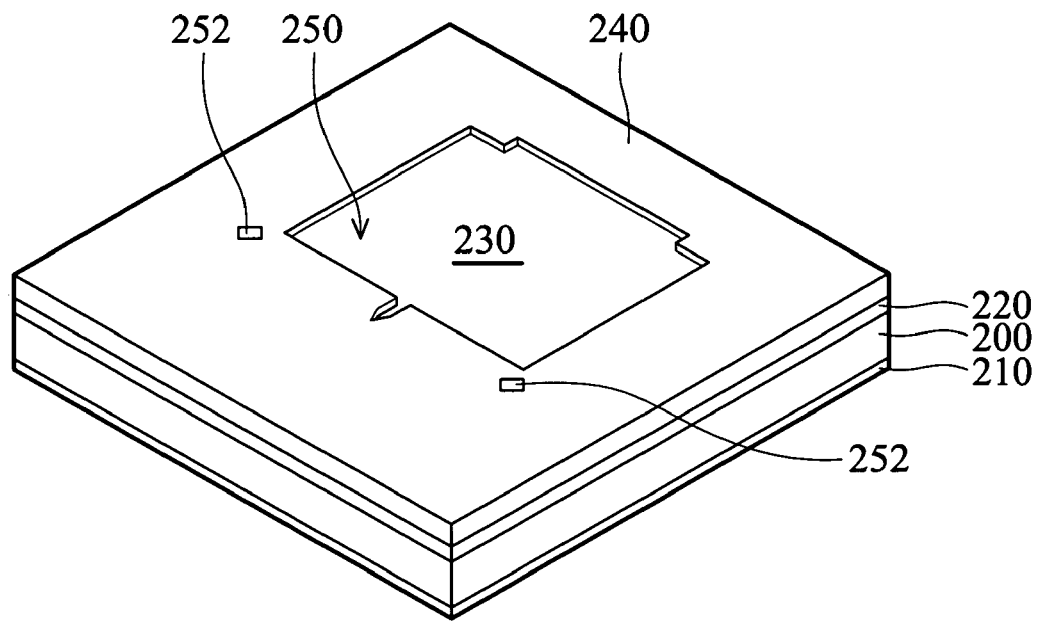

In FIG. 2B, a second sacrificial layer 240 having silicon material is formed on the first sacrificial layer 220 and the mirror plate 230. Using the amine-based etchant of the present invention, the sacrificial layers 220 and 240 are partially etched to create an opening 250 exposing a portion of the mirror plate 230 and at least one hole 252 exposing a portion of the second surface 204 of the substrate 200.

Figure 2C:
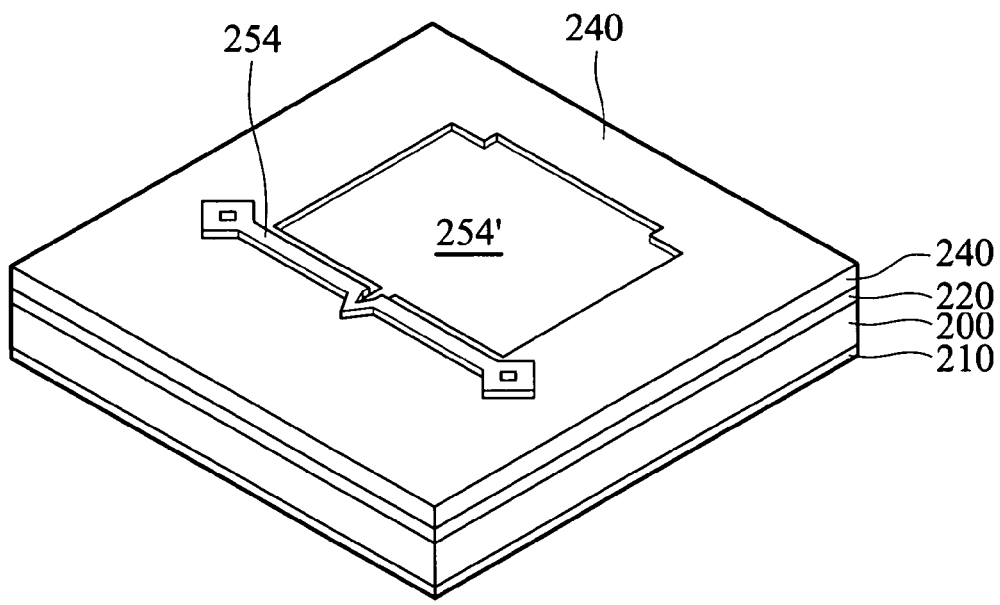

In FIG. 2C, a conductive material is deposited in the opening 250 and the hole 252 and is defined to form a mirror support structure 254 to attach the substrate 200. The conductive material is, for example, W, Mo, Ti, Ta or a conductive metal compound. The mirror support structure 254 as shown has an electrode portion 254' that is attached to the mirror plate 230, and a hinge support structure 254" (shown in FIG. 2H) that is attached to the substrate 200.

Figure 2D:
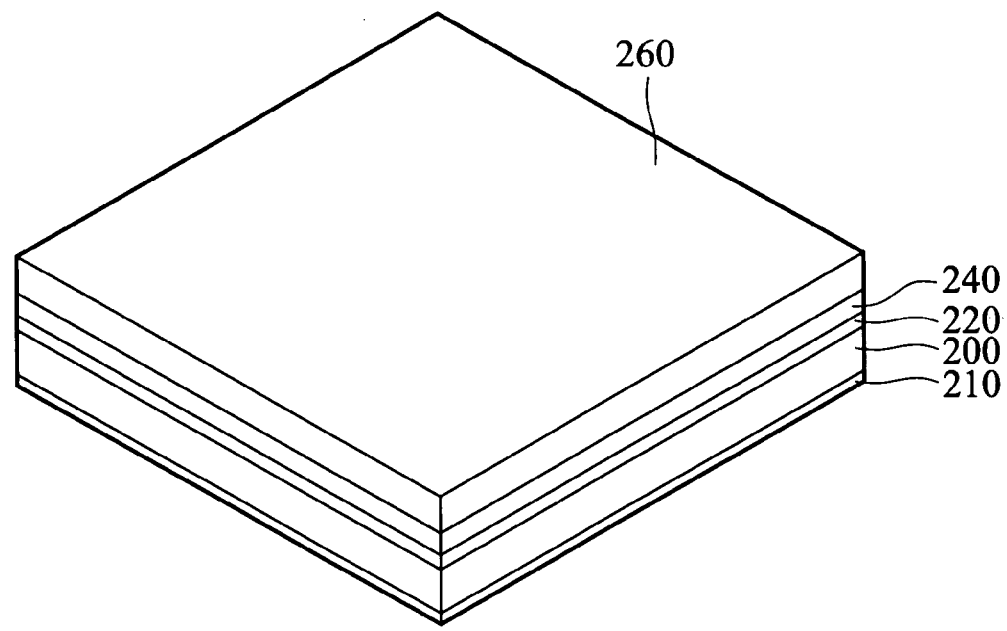

In FIG. 2D, a photoresist layer 260 is blanketly formed over the second surface 204 of the substrate 200.

Figure 2E:
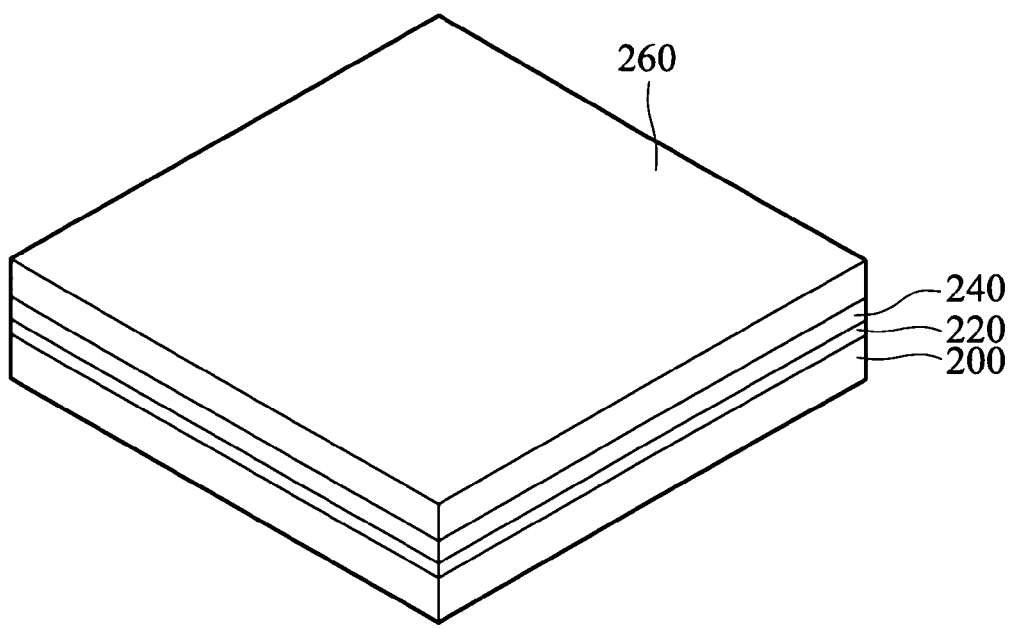

In FIG. 2E, using the photoresist layer 260 as an etching mask, the metal nitride layer 210 is removed. For example, the TiN layer 210 can be removed by dry etching using $F^-$-containing etchant gas.

Figure 2F:
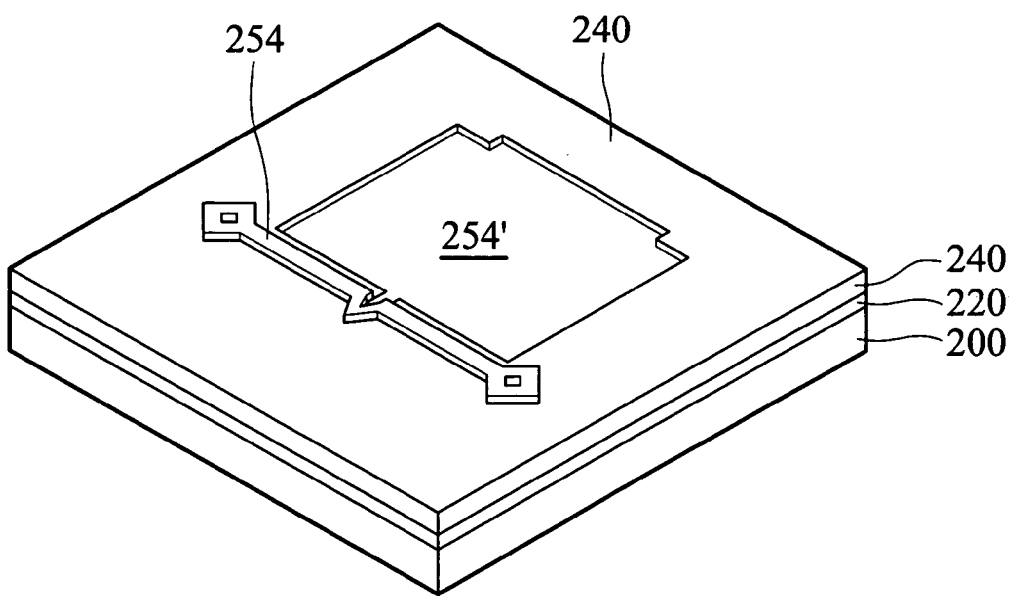

In FIG. 2F, using O₂ ashing, the photoresist layer 260 is removed. Nevertheless, polymer residue (not shown) is created in this step.

Figure 2G:
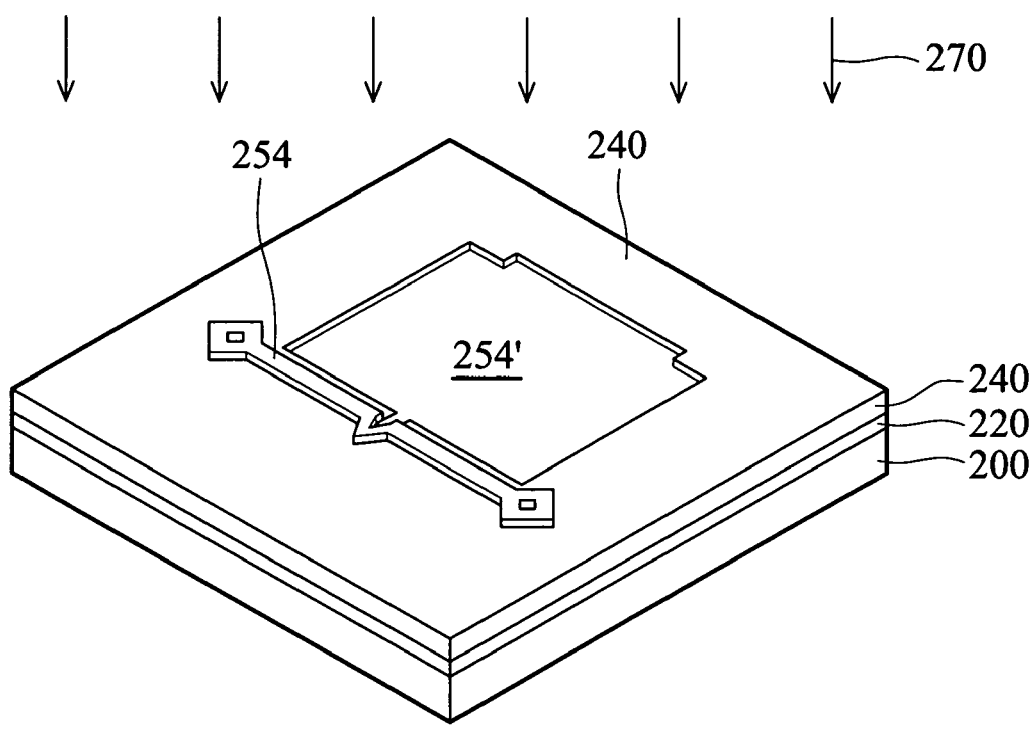
Figure 2H:
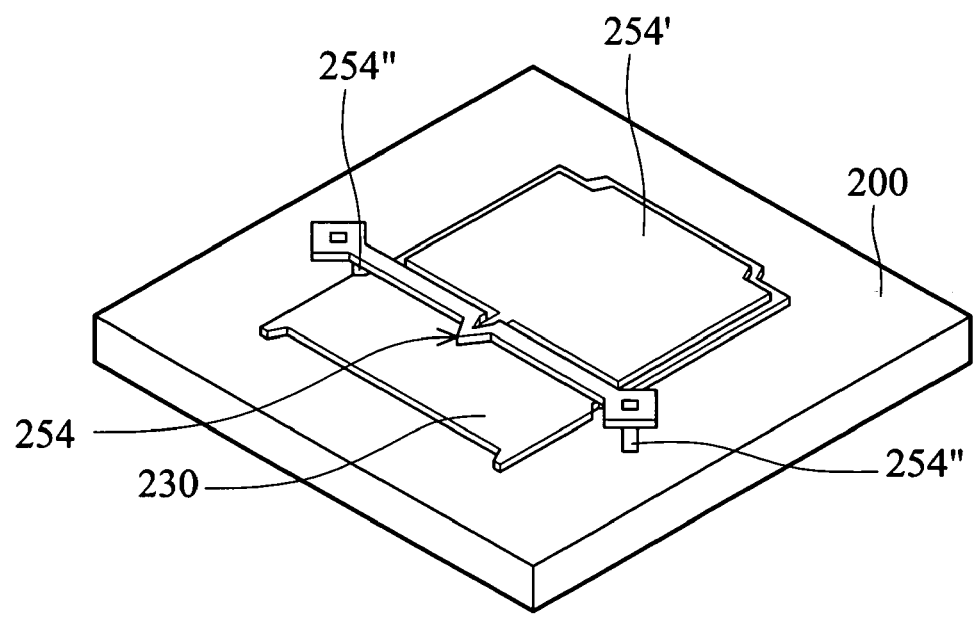

In FIG. 2G, a post-cleaning procedure 270 with the amine-based etchant is performed to simultaneously etch the polymer residue and the sacrificial silicon layers 220 and 240. It should be noted that the post-cleaning procedure 270 with the amine-based etchant can be performed with current wet cleaning equipment. As shown in FIG. 2H, the mirror support structure 254 and the mirror plate 230 (that is, a micromechanical structure) are thus released without performing any additional process (e.g. the XeF₂ etching).

A demonstrative example of the post-cleaning procedure 270 is herein described, but is not intended to limit the present invention. After stripping the photoresist layer 260, the micromechanical device is immersed in ACT-690C for 30 minutes to simultaneously remove polymer residue and (amorphous) silicon, and then is immersed in NMP (N-Methyl-2-Pyrrolidone, serving as a neutralizer) for 5 minutes. Lastly, the micromechanical device is cleaned by DI (deionization) water rinse, and then is dried by spin dryer.

The resulting micromirror structure is ready to be sandwiched with a semiconductor substrate having electrodes and electronic circuitry therein to form a light valve device. The process for forming the semiconductor substrate for actuation of the micromirror structure is described in U.S. Pat. No. 5,835,256, and is therefore not discussed herein to avoid obscuring aspects of the present invention.

Thus, the present invention provides a method for releasing a micromechanical structure. The present method uses the amine-based etchant to simultaneously etch the polymer residue and the sacrificial layer(s) of silicon during the post cleaning procedure with current equipment. Thus, the micromechanical structure can be released without performing any special or additional processes (such as the XeF₂ etching) to etch the sacrificial layer of silicon, thereby reducing tool and material costs and ameliorating the disadvantages of the background art.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for releasing a micromechanical structure, comprising the steps of:
   providing at least one micromechanical structural layer above a substrate, the micromechanical structural layer being sustained by a sacrificial layer having a silicon material; and
   etching the silicon material with an amine-based etchant, wherein the amine-based etchant comprises MEA (monoethanolamine).

2. The method according to claim 1, wherein the substrate is a glass or quartz substrate.

3. The method according to claim 1, wherein the silicon material is at least one of amorphous silicon and crystalline silicon.

4. The method according to claim 1, wherein the silicon material is preferentially etched relative to the micromechanical structural layer and the micromechanical structural layer includes metal material.

5. The method according to claim 1, wherein the amine-based etchant further comprises DMSO (dimethyl sulfoxide).

6. The method according to claim 5, wherein an operational temperature of the amine-based etchant ranges from 90 to 120° C.

7. The method according to claim 1, wherein the amine-based etchant further comprises HDA (hydroxylamine), H₂O, DGA (2-(2 amineoethoxy) ethanol) and Catechol.

8. The method according to claim 7, wherein an operational temperature of the amine-based etchant ranges from 60 to 80° C.

9. A method for forming a micromechanical structure, comprising the steps of:
   providing at least one micromechanical structural layer above a substrate, the micromechanical structural layer being sustained by at least a sacrificial layer having a silicon material; and
   simultaneously wet-etching the sacrificial layer and polymer residues by using an amine-based etchant without substantially damaging non-silicon materials, the polymer residues being generated before the step of simultaneously wet-etching;
   wherein the amine-based etchant comprises MEA (monoethanolamine).

10. The method according to claim 9, wherein the amine-based etchant further comprises DMSO (dimethyl sulfoxide).

11. The method according to claim 9, wherein the amine-based etchant further comprises HDA (hydroxylamine), H₂O, DGA (2-(2 amineoethoxy) ethanol) and Catechol.

* * * * *